(12) United States Patent
Hsieh

(10) Patent No.: US 8,368,452 B2
(45) Date of Patent: Feb. 5, 2013

(54) DELAY CIRCUIT AND SCHEDULE CONTROLLER EMPLOYING THE SAME

(75) Inventor: Ming-Chih Hsieh, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 164 days.

(21) Appl. No.: 13/007,678

(22) Filed: Jan. 17, 2011

(65) Prior Publication Data

US 2012/0133409 A1    May 31, 2012

(30) Foreign Application Priority Data

Nov. 29, 2010 (TW) ................................ 99141139 A

(51) Int. Cl.
*H03K 17/687* (2006.01)
(52) U.S. Cl. ....................................... 327/427; 327/149
(58) Field of Classification Search .................. 327/427, 327/149, 152, 153, 158, 161
See application file for complete search history.

(56) References Cited

U.S. PATENT DOCUMENTS

2011/0122079 A1* 5/2011 Shih et al. ..................... 345/173

\* cited by examiner

*Primary Examiner* — Lincoln Donovan
*Assistant Examiner* — Diana J Cheng
(74) *Attorney, Agent, or Firm* — Altis Law Group, Inc.

(57) ABSTRACT

A delay circuit used in a schedule controller includes a voltage detection unit, a timer, and a first electronic switch. The voltage detection unit receives an input voltage and compares the input voltage with a predetermined voltage. The timer is controlled by the voltage detection unit to calculate duration of an interval time. The first electronic switch is switched on or off under the control of the timer. When the input voltage substantially equals or exceeds the predetermined voltage, the timer calculates duration of the interval time, the timer generates and transmits a switch signal to the first electronic switch when the timing is reached, and the first electronic switch is switched on by the switch signal and provides an output voltage.

16 Claims, 2 Drawing Sheets

DELAY CIRCUIT AND SCHEDULE CONTROLLER EMPLOYING THE SAME

BACKGROUND

1. Technical field

The disclosure generally relates to delay circuits, and more particularly to a delay circuit used in a schedule controller.

2. Description of the Related Art

Timing control chips are commonly employed to manage power in electronic components on motherboards of electronic devices, such as computers, powering the electronic components sequentially and in order according to priority. However, the timing control chips are generally expensive. Thus, timing control circuits including resistors, capacitors and metal oxide semiconductor field effect transistors (MOSFETs) are widely used to replace the timing control chips and reduce costs.

However, when the interval time between the computer powering-off and powering-on is less than the discharge time of the capacitors, the capacitors fail to fully discharge before the capacitors are charged again, resulting in changes in the charging time of the capacitors. Thus, the timing control circuits cannot properly control and manage the power sequences according to the priority, and the computer system cannot be operated normally, or even powered on.

Therefore, there is room for improvement within the art.

BRIEF DESCRIPTION OF THE DRAWINGS

Many aspects of an exemplary delay circuit and schedule controller employing the same can be better understood with reference to the following drawings. The components in the drawings are not necessarily drawn to scale, the emphasis instead being placed upon clearly illustrating the principles of the exemplary delay circuit and schedule controller employing the same. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
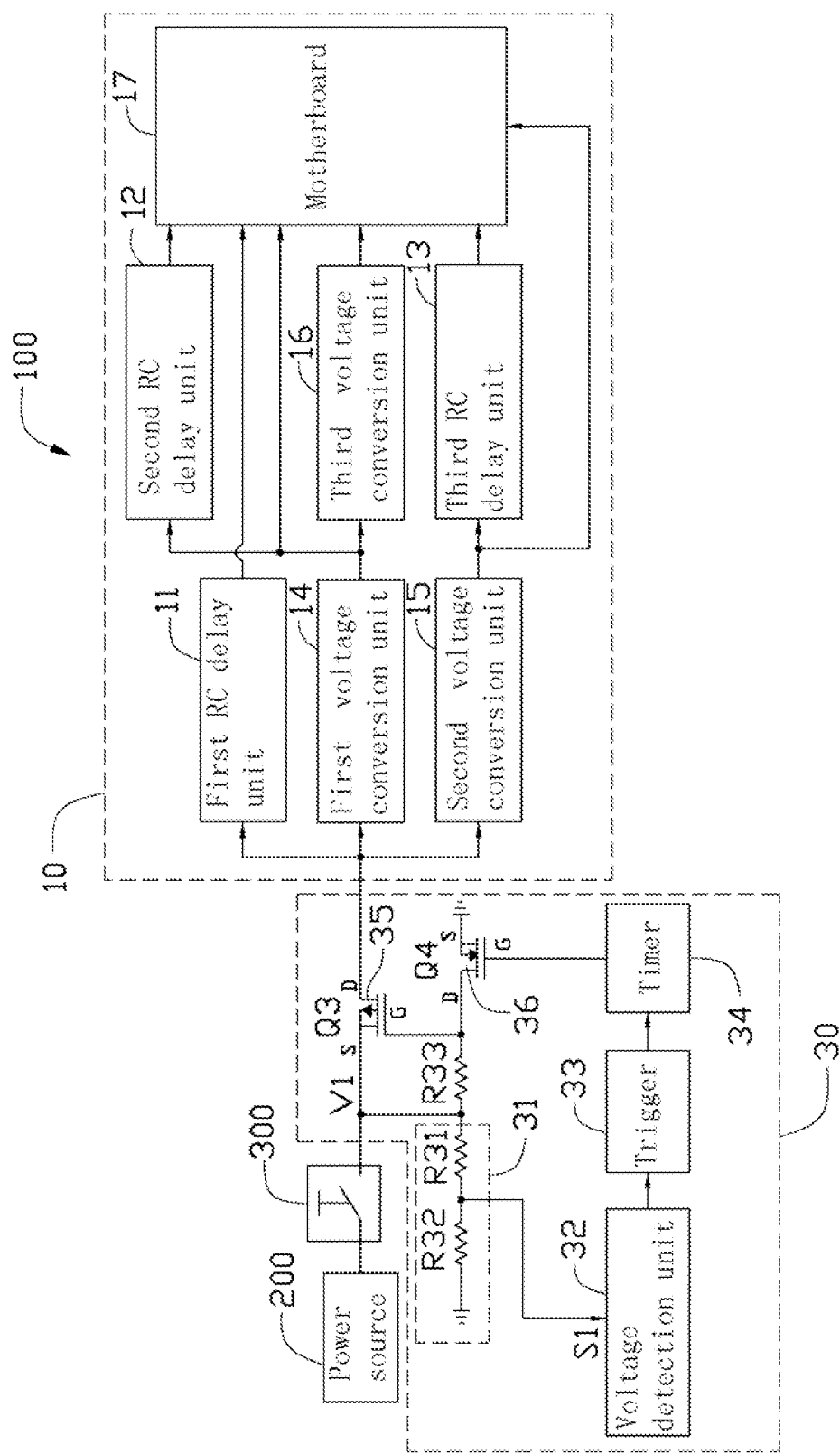
FIG. 1 is a circuit view of a schedule controller including a first RC delay unit, according to an exemplary embodiment.

FIG. 1 shows an exemplary embodiment of a schedule controller 100 used in an electronic device such as computer for power management. The schedule controller 100 includes a sequential control circuit 10 and a delay circuit 30. The delay circuit 30 is electrically connected to a power source 200 through a switch 300, such that power source 200, switch 300, delay circuit 30, and sequential control circuit 10 are electrically connected in series.

The switch 300 can be used to control power to the computer, such as in a power button of the computer. When the switch 300 is activated, the power source 200 provides and outputs voltage V1 for the delay circuit 30 through the switch 300. The voltage V1 is then transmitted from the delay circuit 30 to the sequential control circuit 10 after an interval time T controlled by the delay circuit 30. The sequential control circuit 10 is capable of converting the voltage V1 into different operating voltages, and controlling the start time of the operating voltages according to predetermined power sequences.

The delay circuit 30 includes a voltage division circuit 31, a voltage detection unit 32, a trigger 33, a timer 34, a first electronic switch 35, a second electronic switch 36, and a current limiting resistor R33. The voltage division circuit 31 is electrically connected to the switch 300 to receive the voltage V1. The voltage division circuit 31 can be a voltage divider and is capable of producing an output voltage that is a fraction of its input voltage V1.

In this exemplary embodiment, the voltage division circuit 31 includes a first voltage dividing resistor R31 and a second voltage dividing resistor R32. An end of the first voltage dividing resistor R31 is electrically connected to the switch 300 to receive the voltage V1, the other end is electrically connected to an end of the second voltage dividing resistor R32, and the other end of second voltage dividing resistor R32 is electrically connected to ground. Thus, the voltage V1 from the power source 200 can be divided into corresponding output voltage S1.

An end of the voltage detection unit 32 is electrically connected between the first voltage dividing resistor R31 and the second voltage dividing R32, and the other end is electrically connected to the trigger 33. The voltage detection unit 32 can be a voltage reset integrated circuit (IC), capable of determining whether the divided output voltage S1 from the voltage division circuit 31 is equal to or adjacent to a predetermined voltage. In this exemplary embodiment, when the divided output voltage S1 is less than the predetermined voltage, the voltage detection unit 32 outputs a low voltage level (e.g., logic 0). When the divided output voltage S1 is equal to or adjacent to the predetermined voltage, the voltage detection unit 32 outputs a high voltage level (e.g., logic 1).

The trigger 33 can be a Schmitt trigger, output of which retains its value until the input changes sufficiently to trigger a change. The trigger 33 has the same voltage level changes as the voltage detection unit 32, such that when the voltage level of the trigger 33 according to the voltage detection unit 32 is converted from low (e.g., logic 0) to high (e.g., logic 1), and exceeds a threshold voltage, the trigger 33 then produces and outputs a trigger signal. Similarly, when the voltage level of the trigger 33 is converted from high to low, and is below the threshold voltage, the trigger 33 then produces and outputs another trigger signal.

The timer 34 can be an electronic timer, software timer, or other timer. The timer 34 is electrically connected to the trigger 33 and receives the trigger signal from the trigger 33. When the timer 34 receives the trigger signal, timing between the periods of the interval time T is implemented. When the timing is finished (e.g., reached/expired), the timer 34 then transmits a switch signal (e.g., logic 1) to the second electronic switch 36, enabling the second electronic switch 36 and the first electronic switch 35 to be switched on to provide operating power to the sequential control circuit 10. Thus, power transfer to the sequential control circuit 10.

In this exemplary embodiment, the first electronic switch 35 is a P-channel metal oxide semiconductor field effect transistor (MOSFET) Q3, the second electronic switch 36 is a N-channel MOSFET Q4. The gate of the MOSFET Q4 is electrically connected to the timer 34, the source of the MOSFET Q4 is electrically connected to ground, and the drain of the MOSFET Q4 is electrically connected to the first voltage dividing resistor R31 and the switch 300 through the current limiting resistor R33. The gate of the MOSFET Q3 is electrically connected to between the current limiting resistor R33 and the drain of the MOSFET Q4, the source S of the MOSFET Q3 is electrically connected between the current limiting resistor R33 and first the voltage dividing resistor R31, and is further electrically connected to the power source 200 through the switch 300. The drain of the MOSFET Q3 is electrically connected to the sequential control circuit 10.

In addition, the first electronic switch 35 can be a pnp transistor, whose base, emitter and collector respectively correspond to the gate G, the source S and the drain D of the MOSFET Q3, and have the same circuit connections as the MOSFET Q3. The second electronic switch 36 can be an npn transistor, whose base, emitter and collector respectively correspond to the gate G, the source S and the drain D of the N-channel MOSFET Q4, and have the same circuit connections as the MOSFET Q4. The second electronic switch 36 can also be an inverter including an input port and an output port, the input port of the inverter is electrically connected to the timer 34, and the output port is electrically connected to the gate of the P-channel MOSFET Q3.

Figure 2:
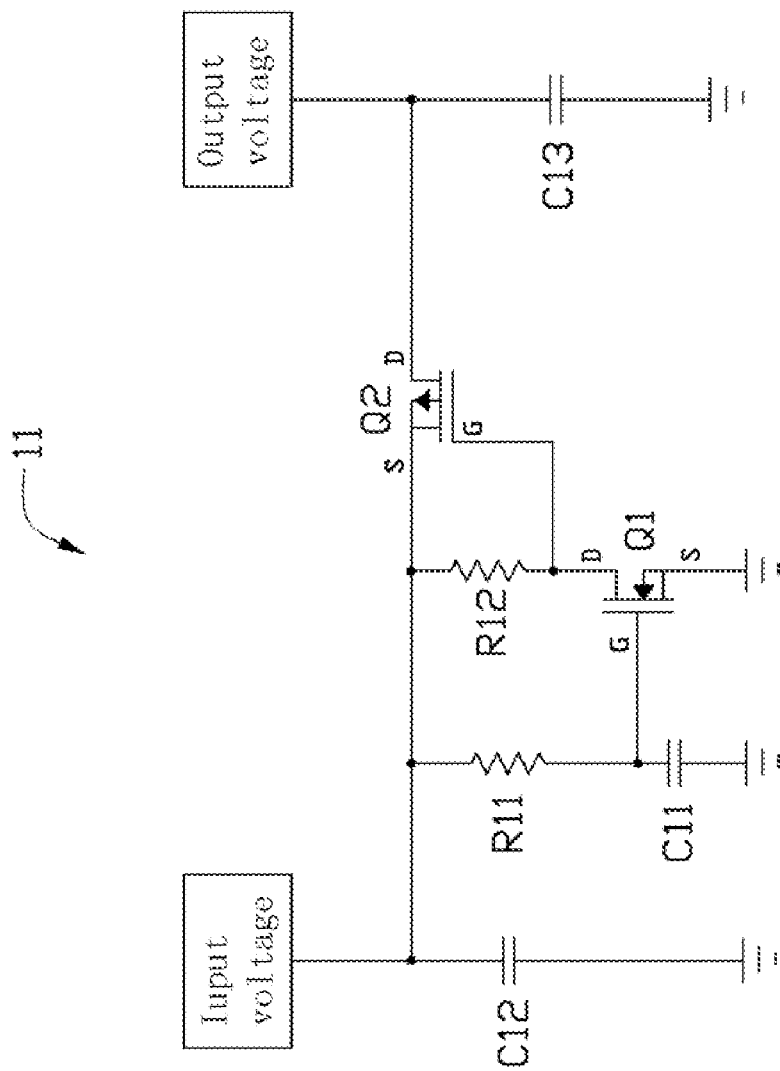
FIG. 2 is a circuit view of the first RC delay unit of the schedule controller of one embodiment shown in FIG. 1.

Referring to FIG. 2, the sequential control circuit 10 includes at least one RC delay unit and at least one voltage conversion unit. In this exemplary embodiment, the sequential control circuit 10 includes a first RC delay unit 11, a second RC delay unit 12, a third RC delay unit 13, a first voltage conversion unit 14, a second voltage conversion unit 15, a third voltage conversion unit 16, and a motherboard 17. The voltage conversion units 14, 15 and 16 can be transformers or power adapters.

In detail, the first RC delay unit 11, the first voltage conversion unit 14 and the second voltage conversion unit 15 are electrically connected between the drain of the MOSFET Q3 and the motherboard 17. The second RC delay unit 12 is electrically connected between the first voltage conversion unit 14 and the motherboard 17. The third RC delay unit 13 is electrically connected between the second voltage conversion unit 15 and the motherboard 17. The third voltage conversion unit 16 electrically connects the first voltage conversion unit 14 and the motherboard 17. Thus, different transmission circuits can be formed in the sequential control circuit 10 to convert the input voltage from the delay circuit 30 into operating voltages and control the start time of the operating voltages according to the predetermined power sequences.

In this exemplary embodiment, the first RC delay unit 11 is used here as an example to illustrate the inner circuit of the RC delay unit. The first RC delay unit 11 includes a resistor R11, a current limiting resistor R12, a capacitor C11, two filter capacitors C12 and C13, an N-channel MOSFET Q1, and a P-channel MOSFET Q2.

In detail, an end of the filter capacitor C12, an end of the resistor R11, an end of the current limiting resistor R12, and the source of the MOSFET Q2 are electrically connected to the drain of the MOSFET Q3 to receive the input voltage. The other end of the filter capacitor C12 is electrically connected to ground. The other end of the resistor R11 is electrically connected to ground through the capacitor C11. The other end of the current limiting resistor R12 is electrically connected to the drain of the MOSFET Q1, the gate of the MOSFET Q1 is electrically connected between the resistor R11 and the capacitor C11, and the source of the MOSFET Q1 is electrically connected to ground. The gate of the MOSFET Q2 is electrically connected between the current limiting resistor R12 and the drain of the MOSFET Q1, and the drain of the MOSFET Q2 is electrically connected to ground through the filter capacitor C13. The drain of the MOSFET Q2 is further electrically connected to the motherboard 17 to output the operating voltage according to the predetermined power sequences.

When the computer is powered on, or the sequential control circuit 10 receives the input voltage from the delay circuit 30, the capacitor C11 is charged by the input voltage accordingly. When the capacitor C11 is fully charged, the voltage level of the gate of the MOSFET Q1 is high, and the MOSFET Q1 is switched on. Thus, the voltage level of the drain of the MOSFET Q1 is low, and the voltage level of the gate of the MOSFET Q2 is low accordingly, so the MOSFET Q2 is switched on. Thus, the input voltage is transmitted from the drain of the MOSFET Q2 to the motherboard 17 to power electronic components (not shown), so the charging time of the capacitor C11 is substantially equal to or adjacent to the interval time of the input voltage.

In addition, the interval time T of the delay circuit 30 can be set to substantially equal or exceed the discharge time of the capacitor C11 of the first RC delay unit 11. Moreover, the discharge time of any capacitor in the RC delay units can be same or different. When the discharge time of each capacitor of the RC delay units is different, the interval time T can be set to substantially or exceed the largest discharge time of the capacitor. For example, if the discharge time of the first RC delay unit 11 is preset to T1, the discharge time of the second RC delay unit 12 is preset to T2, the discharge time of the third RC delay unit 13 is preset to T3, and T1>T2>T3, the interval time T is preset to substantially or exceed the discharge time T1 of the first RC delay unit 11.

The first voltage conversion unit 14, the second voltage conversion unit 15 and the third voltage conversion unit 16 are capable of converting the input voltage from the delay circuit 30 into corresponding operating voltages according to the power sequences to provide operating power for the electronic components on the motherboard 17. In addition, the number of the current conversion units and RC delay units are not limited to four, and the connection orders and arrangements of the RC delay units and the current conversion units can be set and rearranged if needed to obtain different operating voltages and transmission circuits.

In use, when the switch 300 is switched on, the power source 200 is electrically connected to the delay circuit 30 and provides a voltage V1 to the delay unit 30. The voltage V1 is divided to generate and produce an output voltage S1, and when the divided output voltage S1 reaches a predetermined voltage, the voltage detection unit 32 generates and outputs a high voltage level to trigger 33. The trigger 33 then produces and outputs a trigger signal to timer 34, and the timer 34 starts timing during the period of the interval time T. When the timing is completed during the period of the interval time T, the timer 34 then outputs a witch signal to the second electronic switch 36, switching on the second electronic switch 36 and the first electronic switch 35. Thus, the sequential control circuit 10 converts the input voltage from the delay circuit 30 to corresponding operating voltages according to the predetermined power sequences to provide operating power for the electronic components on the motherboard 17.

In summary, in the schedule controller 100 of the exemplary embodiment, the delay circuit 30 is added and electrically connected between the power source 200 and the sequential control circuit 10, so when the electronic device is powered on, the delay circuit 30 can adjustably delay an interval time T and the power source can be transmitted and provided for the sequential control circuit 10 after time T, exceeding or substantially equaling the discharge time of the delay units. Thus, the delay units of the sequential control unit 10 are able to fully discharge, and the sequential control circuit 10 can properly control and manage the power source according to power sequences.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A schedule controller, comprising:
a delay circuit electrically connected to a power source to receive an input voltage, the delay circuit comprising:
a voltage detection unit electrically connected to the power source, the voltage detection unit receiving the input voltage from the power source and comparing the input voltage with a predetermined voltage;
a timer electrically connected to the voltage detection unit; and
a first electronic switch electrically connected to the timer, the first electronic switch being switched on or off under the control of the timer; and
a sequential control circuit electrically connected to the first electronic switch, the sequential control circuit providing a power sequence, wherein the when the voltage detection unit detects the input voltage is equal to or larger than the predetermined voltage, the timer is enabled to start timing during an interval time, and generates and outputs a switch signal to the first electronic switch when the interval time is reached, the first electronic switch is switched on under the control of the switch signal, and provides an output voltage to the sequential control circuit, the sequential control circuit controls and manages the output voltage according to the power sequence, the sequential control circuit comprises a first RC delay unit, a first voltage conversion unit, and a motherboard, the first RC delay unit, the first voltage conversion unit are electrically connected between the first electronic switch and the motherboard.

2. The schedule controller as claimed in claim 1, wherein the sequential control circuit further comprises a second RC delay unit and a second voltage conversion unit, the second voltage conversion unit is electrically connected between the first electronic switch and the motherboard, the second RC delay unit is electrically connected between the first voltage conversion unit and the motherboard.

3. The schedule controller as claimed in claim 2, wherein the sequential control circuit further comprises a third RC delay unit and a third voltage conversion unit, the third RC delay unit is electrically connected between the second voltage conversion unit and the motherboard, the third voltage conversion unit is electrically connected between the first voltage conversion unit and the motherboard.

4. The schedule controller as claimed in claim 3, wherein the sequential control circuit converts the input voltage from the delay circuit into operating voltages and controls start time of the operating voltages according to the predetermined power sequences.

5. The schedule controller as claimed in claim 1, wherein the delay circuit comprises a voltage division circuit electrically connected to the power source and the voltage detection unit, the voltage division circuit is capable of providing the input voltage for the voltage detection unit.

6. The schedule controller as claimed in claim 5, wherein the voltage division circuit comprises a first voltage dividing resistor and a second voltage dividing resistor, an end of the first voltage dividing resistor is electrically connected to the power source to receive the input voltage, the other end is electrically connected to an end of the second voltage dividing resistor, the other end of second voltage dividing resistor is electrically connected to ground, and the voltage detection unit is electrically connected between the first voltage dividing resistor and the second voltage dividing.

7. The schedule controller as claimed in claim 1, wherein the delay circuit comprises a trigger electrically connected between the voltage detection unit and the timer, the trigger has the same voltage level changes as the voltage detection unit, when the voltage level of the trigger according to the voltage detection unit is converted from low to high, and exceeds a threshold voltage, the trigger produces and outputs a trigger signal, and when the voltage level of the trigger is converted from high to low, and is below the threshold voltage, the trigger then produces and outputs a trigger signal.

8. The schedule controller as claimed in claim 1, wherein the delay circuit comprises a second electronic switch electrically connected to the timer and the first electronic switch, and when the timing is reached by the timer, the timer transmits the switch signal to the second electronic switch, and the second electronic switch and the first electronic switch are switched on to provide and output the output voltage.

9. The schedule controller as claimed in claim 8, wherein the first electronic switch is a P-channel MOSFET or a pnp transistor, and the second electronic switch is a N-channel MOSFET, an npn transistor, or an inverter.

10. A schedule controller, comprising:
a delay circuit electrically connected to a power source to receive an input voltage, the delay circuit comprising:
a voltage detection unit electrically connected to the power source, the voltage detection unit receiving the input voltage from the power source and comparing the input voltage with a predetermined voltage;
a timer electrically connected to the voltage detection unit; and
a first electronic switch electrically connected to the timer, the first electronic switch being switched on or off under control of the timer; and
a sequential control circuit electrically connected to the first electronic switch, the sequential control circuit providing a power sequence, wherein the when the voltage detection unit detects the input voltage is equal to or greater than the predetermined voltage, the timer starts timing during an interval time, and outputs a switch signal to the first electronic switch when the interval time is reached; the first electronic switch is switched on under the control of the switch signal, and provides an output voltage to the sequential control circuit; the sequential control circuit controls the output voltage according to the power sequence, the sequential control circuit comprises a plurality of RC delay units, each of the RC delay units comprises a plurality of resistors and capacitors forming charging and discharge circuits, the interval time is equal to or greater than discharge time of the capacitors.

11. The schedule controller as claimed in claim 10, wherein the sequential control circuit converts the input voltage from the delay circuit into operating voltages and controls start time of the operating voltages according to the predetermined power sequences.

12. The schedule controller as claimed in claim 10, wherein the delay circuit comprises a voltage division circuit electrically connected to the power source and the voltage detection unit, the voltage division circuit providing the input voltage for the voltage detection unit.

13. The schedule controller as claimed in claim 12, wherein the voltage division circuit comprises a first voltage dividing resistor and a second voltage dividing resistor, a first end of the first voltage dividing resistor is electrically connected to the power source to receive the input voltage, a second end of the first voltage dividing resistor electrically connected to a first end of the second voltage dividing resistor, a second end of second voltage dividing resistor is electrically connected to ground, and the voltage detection unit is electrically connected between the first voltage dividing resistor and the second voltage dividing.

14. The schedule controller as claimed in claim 10, wherein the delay circuit comprises a trigger electrically connected between the voltage detection unit and the timer, the trigger has a same voltage level changes as the voltage detection unit, when the voltage level of the trigger according to the voltage detection unit is converted from low to high, and exceeds a threshold voltage, the trigger produces and outputs a trigger signal, and when the voltage level of the trigger is converted from high to low, and is below the threshold voltage, the trigger outputs a trigger signal.

15. The schedule controller as claimed in claim 10, wherein the delay circuit comprises a second electronic switch electrically connected to the timer and the first electronic switch, and when the timing is reached by the timer, the timer transmits the switch signal to the second electronic switch, and the second electronic switch and the first electronic switch are switched on to provide and output the output voltage.

16. The schedule controller as claimed in claim 15, wherein the first electronic switch is a P-channel MOSFET or a pnp transistor, and the second electronic switch is a N-channel MOSFET, an npn transistor, or an inverter.

* * * * *